United States Patent [19]

Smith

[11] Patent Number: 5,657,120

[45] Date of Patent: Aug. 12, 1997

[54] LASER DIODE SYSTEM FOR RAMAN SPECTROSCOPY

[75] Inventor: Brian J. E. Smith, Bristol, United Kingdom

[73] Assignee: Renishaw plc, Gloucestershire, United Kingdom

[21] Appl. No.: 574,164

[22] Filed: Dec. 18, 1995

[30] Foreign Application Priority Data

Dec. 24, 1994 [GB] United Kingdom ............... 9426242

[51] Int. Cl.⁶ ........................ H01S 3/098; G01N 21/65
[52] U.S. Cl. ............................................. 356/301; 372/32
[58] Field of Search .................................. 372/32; 356/301

[56] References Cited

U.S. PATENT DOCUMENTS 5,319,668  6/1994  Luecke ............................ 372/107
5,424,825  6/1995  Delhaye et al. ............... 356/301 X

FOREIGN PATENT DOCUMENTS 0 543 578 A1  5/1993  European Pat. Off.
57-99793      6/1982  Japan.
63-308987    12/1988  Japan.

OTHER PUBLICATIONS

Sato, et al., "Design of Nondispersion Optical Feedback System Using Diffraction Grating for Semiconductor Laser Multiple Longitudinal Modes Control," *IEEEE*, pp. 155–157, Feb. 1982.

Maki, et al., "Stabilized Diode–laser System with Grating Feedback and Frequency–offset Locking," *Optics Communications 102* pp. 251–256, 1 Oct. 1993.

Rehman, et al., "Continuous Wavelength Tuning of Brewster Angled Semiconductor Lasers," *Electronic Letters*, vol. 27, No. 1, pp. 23–24, Jan. 1991.

H. Patrick et al., "Frequency stabilization of a diode laser using simultaneous optical feedback from a diffraction grating and a narrowband Fabry–Perot cavity," *Rev. Sci. Instrum.* 62 (11), Nov. 1991 pp. 2593–2595.

Littman & Metcalf, Applied Optics, "Spectrally narrow pulsed dye laser without beam expander", vol. 17, No. 14, 15 Jul. 1978, pp. 2224–2227.

Derwent Abstracts: AN 94–135835/16, AN 94–264234/32, AN 94–255567/31, AN 93–067365/08, AN 93–067363/08, AN 92–141387/17, AN 91–109641/15, AN 91–073191/10 and AN 89–060978/08.

*Primary Examiner*—Vincent P. McGraw
*Attorney, Agent, or Firm*—Oliff & Berridge

[57] ABSTRACT

A diffraction grating receives a laser beam from a semiconductor laser diode. Light is diffracted in a first order of diffraction of the grating, through an aperture which selects a desired wavelength, free from side modes of the laser diode. A minor proportion of the light is reflected back by a glass window, and is fed back into the laser diode to stabilise it, preventing mode hopping. The majority of the light of the desired wavelength passes through the window to an output. Because the output light is both free from side modes and not subject to mode hopping, it is suitable for use as the exciting light in spectroscopy, including Raman spectroscopy.

11 Claims, 1 Drawing Sheet

LASER DIODE SYSTEM FOR RAMAN SPECTROSCOPY

FIELD OF THE INVENTION

The present invention relates to a semiconductor laser system. Preferred embodiments of the invention may be used as a light source for spectroscopic applications, particularly Raman spectroscopy.

DESCRIPTION OF PRIOR ART

An example of apparatus for Raman spectroscopy is described in European Patent Application No. EP 543578. It uses a Helium-Neon laser as a light source for exciting Raman scattering in a sample. However, for reasons of convenience and expense, it would be desirable to be able to use a semi-conductor laser diode as a light source. Laser diodes with an adequate power output are now available.

However, laser diodes oscillate in several modes (frequencies) and consequently their outputs have side modes in addition to the desired main mode. The raw laser output is therefore unsuitable for Raman spectroscopy unless such side mode activity can be suppressed. The degree of suppression required may be more than six orders of magnitude.

Another problem is that stray light from the spectroscopy apparatus may be reflected back into the laser diode. This can cause "mode hopping" in which the main laser output frequency hops from one mode to another. The laser diode must therefore be stabilised to prevent such mode hopping.

Much work has previously been done to produce stable laser diode systems, but such work has largely been directed towards applications in telecommunications or interferometry, where frequency or wavelength stabilisation is required. Thus, the particular needs of spectroscopic applications, outlined above, have not been met.

One known system which is commercially available from New Focus Inc. of Sunnyvale, Calif., USA is shown in U.S. Pat. No. 5,319,668 (Luecke). See also Michael G. Littman and Harold J. Metcalf, "Spectrally narrow pulsed dye laser without beam expander", Applied Optics, vol. 17, no. 14, 15th Jul. 1978, pp. 2224–2227.

This commercially available system is shown schematically in FIG. 1 of the accompanying drawings. Within a housing 10, there is provided a laser diode 12 mounted on a temperature stabilised mount 14. A lens 16 collimates the light output from the laser diode 12 and directs it towards a diffraction grating 18. Light of the zeroth order of diffraction is directed out of the housing as a beam 22 from a port 20, for use as desired. A small amount of light in the first order of diffraction is directed towards a mirror 23, which reflects it back into the diode 12 (via the grating 18). This feedback, at a frequency selected by the diffraction grating 18, stabilises the laser diode 12 to prevent mode hopping. Effectively, the grating 18 and mirror 23 provide an external cavity for the laser diode. However, there is no side mode suppression in the output beam 22 from the port 20.

This known system cannot in practice be used for a spectroscopic application such as Raman spectroscopy, e.g. with the apparatus shown in EP 543578. It would be necessary to insert a filter, e.g. as shown at 24, to suppress the side modes. Otherwise, the side modes would be so strong that they would swamp any Raman signal, particularly close to the laser frequency. This filter 24 would be needed in addition to any filtering of the laser light which takes place in the spectroscopic apparatus (for example by means of the holographic or dichroic filter disclosed in EP 543578, which injects the laser beam into the same optical path as the Raman scattered light). Furthermore, using a single commercially available filter for the filter 24 might produce only three orders of magnitude of suppression of the side modes, while passing only 60% of the main laser frequency. To obtain six orders of magnitude of suppression would require two such filters in series, and this would result in passing only 36% of the required main frequency. With laser diodes of the power outputs currently available, such power attenuation would leave insufficient laser light for many spectroscopic applications, particularly Raman applications.

SUMMARY OF THE INVENTION

According to the present invention, a semiconductor laser system comprises:

a semiconductor laser for producing a laser beam;

a diffraction grating in the path of the laser beam, for producing dispersed light in a first or higher order of diffraction;

a reflecting device for feeding a part of said dispersed light back to the semiconductor laser, thereby to stabilise the semiconductor laser;

an aperture in the path of dispersed light in a first or higher order of diffraction of the grating for selecting light of a particular wavelength; and an output from the system for outputting said selected light.

At least in the preferred embodiments, such a system can both prevent mode hopping and suppress side modes of the semiconductor laser.

DESCRIPTION OF PREFERRED EMBODIMENTS

Figure 1:
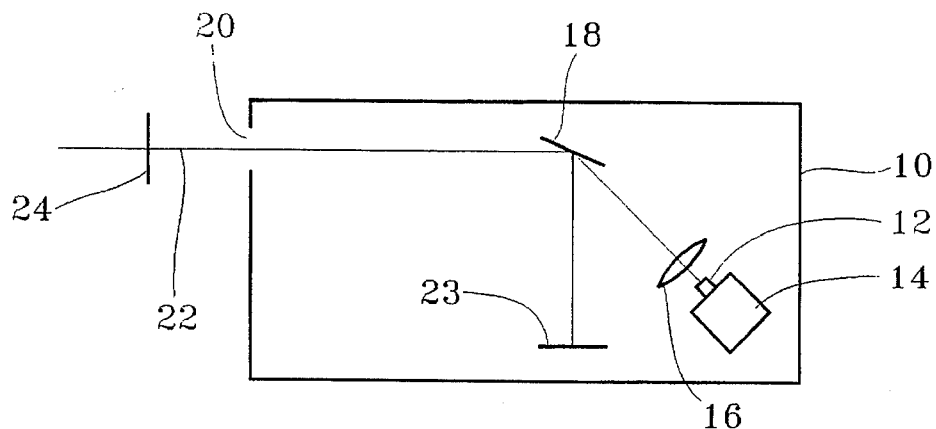
FIG. 1 is a schematic diagram of a known, commercially available laser diode system.
Figure 2:
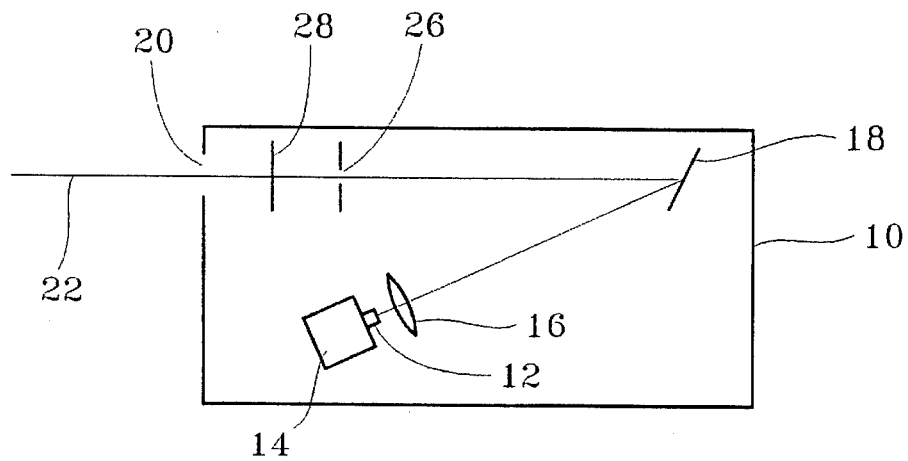
FIGS. 2 and 3 are schematic diagrams of two examples of laser diode systems according to the present invention.

FIG. 2 shows an example of a laser diode system according to the present invention. Here, within the housing 10 there is provided a laser diode 12 having a temperature stabilised mount 14 and a collimating lens 16, as in FIG. 1. This produces a laser beam at 780 nm which is directed towards a diffraction grating 18. In the present example, the grating 18 may have 1800 lines/mm, and is of a design which diffracts as much light as possible in the first order of diffraction, and relatively little in the zeroth or higher orders (e.g. by having appropriate blazing). The quality of the grating should be high, since if it produces much stray light this limits the suppression of side modes.

The output beam 22 from the port 20 is produced by the first order of diffraction from the grating 18. Before reaching the port 20, however, it passes through an aperture in a plate 26. Because light of different frequencies in the first order of diffraction is dispersed (unlike the zeroth order used in FIG. 1) this aperture rejects light having a frequency outside a certain passband. For an aperture of 2 mm diameter (similar to the diameter of the laser beam produced by the lens 16), and for a distance of about 30 cm between the grating 18 and the aperture 26, the passband is about 40 $cm^{-1}$ wide (full width at half maximum). Side modes outside this passband are therefore rejected. Any broad-band, non-coherent spontaneous emission from the laser diode is also rejected. When the present laser diode system is used in conjunction with the spectroscopic apparatus of EP 543578, side bands within this 40 cm$^{-1}$ passband are not a problem since they are sufficiently rejected by the holographic filter described in that application. Furthermore, any apertures in the light delivery system in the spectroscopic apparatus act to further reduce the side mode contribution to the beam, since the light is still dispersing relative to the grating 18.

The housing 10 in FIG. 2 also contains a reflecting device in the form of a window 28, e.g. of glass. This is located after the aperture 26, and passes the majority of the laser beam to the output port 20. However, it reflects a minor proportion (say 4%) back into the laser diode 12, via the aperture 26 and grating 18. This feedback acts in a similar manner to the feedback from the mirror 23 in FIG. 1, in order to prevent mode hopping. The grating 18 and window 28 may form an external cavity for the laser diode, as in FIG. 1. Since the light is fed back via the grating 18, the wavelength selectivity of the stabilising light is effectively doubled. Also, unlike FIG. 1, if stray light from the spectroscopy apparatus is received, the grating ensures that only stray light of the desired mode is fed back to the diode, further stabilising this mode. Of course, it would be possible to arrange the reflecting device 28 between the grating 18 and the aperture 26, but this is not preferred.

Comparative tests between an embodiment of the invention as shown in FIG. 2 and a prior art system as shown in FIG. 1 give the following results. The system of FIG. 2 had only very weak side mode activity beyond 50 cm$^{-1}$ from the main laser line, up to a shift of about 250 cm$^{-1}$, and was at least three orders of magnitude down on the main peak at 20 cm$^{-1}$. The system of FIG. 1, on the other hand, showed side mode activity which was three orders of magnitude higher than required out to beyond 400 cm$^{-1}$. Since the laser diodes 12 in each case produce nominally the same side bands, this difference is directly attributable to the layout used in FIG. 2.

Tests with the system of FIG. 2 and a silicon sample in the spectroscopic apparatus of EP 543578 showed a clearly visible Raman line for silicon at 520 cm$^{-1}$, whereas this was not possible because of the side modes with the system of FIG. 1. This test was repeated, but including a second holographic filter for Rayleigh line rejection after the first one in the apparatus of EP 543578. Although it was possible to detect some small amount of side mode activity from the laser, useful measurements on the sample could nevertheless be taken. If some attenuation of the power of the laser beam can be tolerated, it would be possible to include a bandpass filter in the system of FIG. 2, in the same position as the filter 24 in FIG. 1. This could produce a further suppression of three orders of magnitude on the side modes whilst still giving usable laser power. It would then be possible to take Raman measurements at wavenumbers very close to the Rayleigh line limited only by the performance of the holographic filter in EP 543578.

Figure 3:
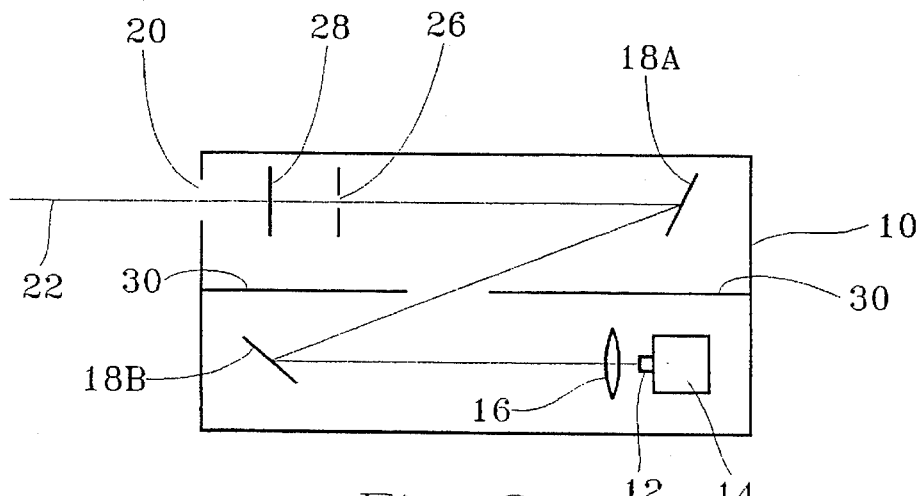

FIG. 3 shows another embodiment, which obviates any need for the filter 24. The arrangement is similar to FIG. 2; similar components have been given the same reference numerals and their description will not be repeated. However, instead of a single grating 18, two gratings 18A, 18B are placed in series. Internal light shields 30 assist in the suppression of stray light. This arrangement gives about six orders of magnitude of stray light suppression, and the passband given by the aperture 26 improves from the previous 40 cm$^{-1}$ to 15 cm$^{-1}$ (i.e. ±7.5 cm$^{-1}$). In practical measurements with the spectroscopic apparatus of EP 543578, no measurable side mode activity was found at all. Furthermore, the passband for feedback into the laser is narrower, at ±3.0 cm$^{-1}$, as opposed to ±9.3 cm$^{-1}$ in FIG. 2.

If desired, a system could be designed with a similar layout to FIG. 3, but with only one diffraction grating, at 18B. At the position 18A, a simple mirror could be provided, oriented to fold the light from the grating 18B towards the aperture 26. For a given grating and a given amount of dispersion at the aperture 26, this folded arrangement could be fitted into a smaller housing than the arrangement of FIG. 2.

The above embodiments of the invention have used a dispersive output which is the first order beam from the diffraction grating or gratings. However, it will be appreciated that the dispersive output may be in the second or higher order of diffraction, using an appropriate diffraction grating. Furthermore, one of the dispersive orders could be taken as the output of the system via the aperture 26, while another dispersive order could be used to feed light back to the laser diode 12 via a mirror similar to the mirror 23 in FIG. 1.

I claim:

1. A semiconductor laser system, comprising:
   a semiconductor laser for producing a laser beam;
   a diffraction grating in the path of the laser beam, for producing dispersed light in a first or higher order of diffraction;
   a reflecting device for feeding a part of said dispersed light back to the semiconductor laser, thereby to stabilise the semiconductor laser;
   an aperture in the path of dispersed light in a first or higher order of diffraction of the grating for selecting light of a particular wavelength; and
   an output from the system for outputting said selected light, wherein the reflecting device reflects a minor proportion of the dispersed light back to the semiconductor laser, and transmits a majority thereof towards the output.

2. A system according to claim 1, wherein said reflecting device is located between the aperture and the output.

3. A system according to claim 1, wherein the reflecting device comprises a glass window.

4. A system according to claim 1, wherein said dispersed light is in the first order of diffraction of the grating.

5. A system according to claim 1, wherein there are two diffraction gratings in series in the path of the laser beam, for producing said dispersed light.

6. A sample illumination device for a spectroscopy system, comprising:
   a semiconductor laser for producing a laser beam directed along a path to illuminate a sample;
   a diffraction grating in the path of the laser beam, for producing dispersed light in a first or higher order of diffraction;
   a reflecting device separate from the sample for feeding a part of said dispersed light back to the semiconductor laser, thereby to stabilize the semiconductor laser; and
   an aperture in the path of dispersed light in a first or higher order of diffraction of the grating for selecting light of a particular wavelength and passing it to the sample.

7. A system according to claim 6, wherein the reflecting device reflects a minor proportion of the dispersed light back to the semiconductor laser, and transmits a majority thereof towards the sample.

8. A system according to claim 7, wherein said reflecting device is located between the aperture and the sample.

9. A system according to claim 7, wherein the reflecting device comprises a glass window.

10. A system according to claim 6, wherein said dispersed light is in the first order of diffraction of the grating.

11. A system according to claim 6, wherein there are two diffraction gratings in series in the path of the laser beam, for producing said dispersed light.

* * * * *